(12) United States Patent
Yoshida et al.

(10) Patent No.: US 9,583,407 B2
(45) Date of Patent: Feb. 28, 2017

(54) SEMICONDUCTOR DEVICE

(71) Applicant: Mitsubishi Electric Corporation, Tokyo (JP)

(72) Inventors: Hiroshi Yoshida, Tokyo (JP); Yoshitaka Otsubo, Tokyo (JP); Hidetoshi Ishibashi, Tokyo (JP); Kenta Nakahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/953,953

(22) Filed: Nov. 30, 2015

(65) Prior Publication Data
US 2016/0315023 A1 Oct. 27, 2016

(30) Foreign Application Priority Data
Apr. 27, 2015 (JP) .................. 2015-090011

(51) Int. Cl.
*H01L 23/31* (2006.01)
*H01L 23/053* (2006.01)
*H01L 23/10* (2006.01)
*H01L 23/13* (2006.01)
*H01L 23/498* (2006.01)
*H01L 23/373* (2006.01)
(Continued)

(52) U.S. Cl.
CPC ............ *H01L 23/053* (2013.01); *H01L 23/10* (2013.01); *H01L 23/13* (2013.01); *H01L 23/3142* (2013.01); *H01L 23/3735* (2013.01); *H01L 23/49811* (2013.01); *H01L 23/49838* (2013.01); *H01L 23/49861* (2013.01); *H01L 24/83* (2013.01); *H01L 23/057* (2013.01); *H01L 23/293* (2013.01); *H01L 24/29* (2013.01); *H01L 24/48* (2013.01); *H01L 24/49* (2013.01); *H01L 24/73* (2013.01); *H01L 2224/291* (2013.01); *H01L 2224/48091* (2013.01); *H01L 2224/48227* (2013.01); *H01L 2224/49109* (2013.01); *H01L 2224/73265* (2013.01); *H01L 2224/83385* (2013.01)

(58) Field of Classification Search
CPC ............ H01L 2924/00; H01L 23/5389; H01L 23/49833; H01L 23/49575; H01L 23/3114; H01L 23/4951
USPC .......................... 257/693, 328, 690
See application file for complete search history.

(56) References Cited

U.S. PATENT DOCUMENTS

2012/0032316 A1* 2/2012 Nishikawa ............ H01L 21/565
257/676

FOREIGN PATENT DOCUMENTS

| JP | 2007-134563 A | 5/2007 | |
| JP | 2007-201346 A | 8/2007 | |
| JP | EP 2709148 A1 * | 3/2014 | ............ H01L 24/34 |

* cited by examiner

*Primary Examiner* — Chuong A Luu
*Assistant Examiner* — Rodolfo D Fortich
(74) *Attorney, Agent, or Firm* — Studebaker & Brackett PC

(57) ABSTRACT

A first conductor layer is provided on a first surface of an insulating plate, and has a first volume. A second conductor layer is provided on a second surface of the insulating plate, and has a second volume. A third conductor layer is provided on a second surface of the insulating plate, and has a second volume. The third conductor layer has a mounting region thicker than the second conductor layer. The sum of the second and third volumes is greater than or equal to 70% and smaller than or equal to 130% of the first volume. A semiconductor chip is provided on the mounting region. A (Continued)

sealing part is formed of an insulator, and seals the semiconductor chip within a case.

8 Claims, 9 Drawing Sheets

(51) Int. Cl.
*H01L 23/057* (2006.01)
*H01L 23/29* (2006.01)
*H01L 23/00* (2006.01)

F I G. 6
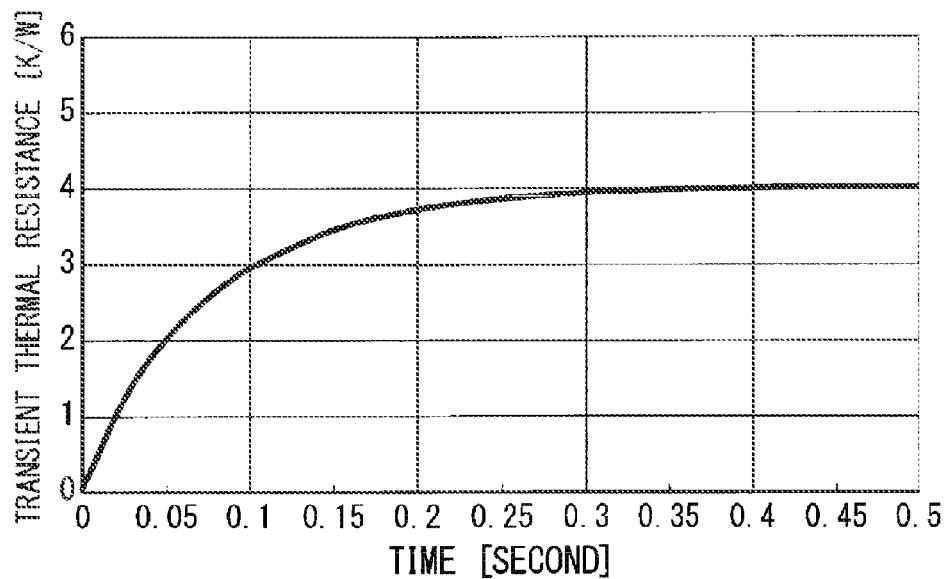
F I G. 7
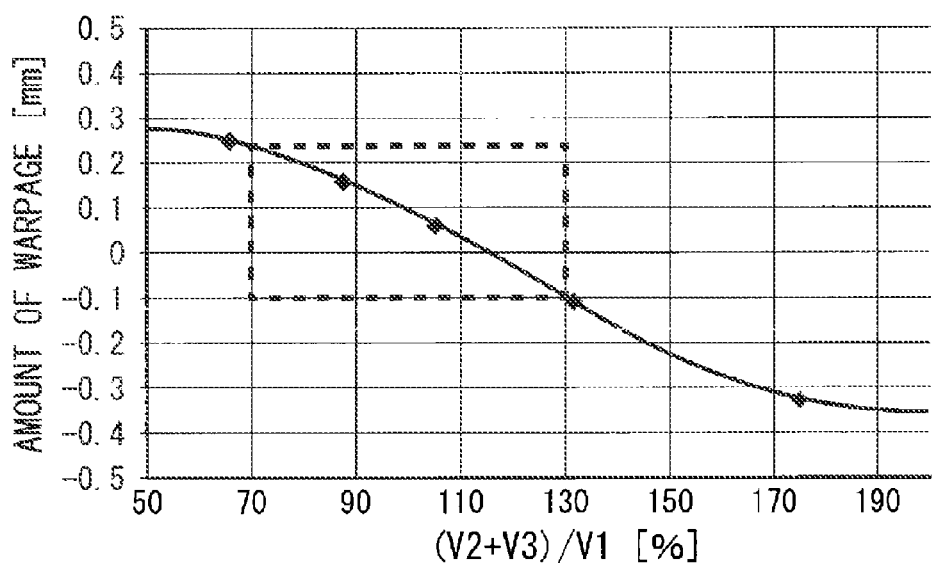

SEMICONDUCTOR DEVICE

BACKGROUND OF THE INVENTION

1. Field of the Invention

The present invention relates to semiconductor devices, and more particularly to a semiconductor device having a semiconductor chip provided on a circuit substrate.

2. Description of the Background Art

In the field of semiconductor devices, hopes for power devices that can contribute to enhanced energy efficiency have risen for achieving low carbon society. Semiconductor chips used in the field of power devices have been more integrated and have operated at higher speeds. Consequently, the semiconductor chips have had higher power densities and higher heat generation. In response to this, the semiconductor devices have been required to have a higher capability of heat radiation. A capability of heat radiation considerably depends on circuit substrates where the semiconductor chips are mounted.

Japanese Patent Application Laid-Open Publication No. 2007-134563 discloses a circuit substrate including a ceramic substrate and a metal circuit pattern formed by etching. The ceramic substrate has a metal layer bonded on its back surface. The metal layer is used to bond a radiator plate onto the layer. Moreover, the publication indicates that a thick part and thin part of a metal circuit need to be formed on one substrate in view of the fact that a power part and a control part of a power module have different amounts of current flowing through an element.

Japanese Patent Application Laid-Open Publication No. 2007-201346 indicates a problem when a metallized layer (metal layer) and a heat spreader (radiator plate) are bonded by soldering. Specifically, the publication indicates that presence of a solder layer causes the heat spreader to have an insufficient capability of heat radiation. Accordingly, in a technique described in the publication, a ceramic substrate has a thick-film heat-radiating conductor circuit formed on its surface, where the circuit is formed of a sintered body of metal particles.

In a circuit substrate, a circuit pattern and an insulating plate that supports the pattern are made of different materials. If temperature of a semiconductor device changes, warpage occurs in the circuit substrate due to a difference of thermal expansion coefficient between the different materials. Techniques described in the publications described above fail to consider preventing such warpage.

SUMMARY OF THE INVENTION

The present invention has been made to solve the above-mentioned problem, and it is an object of the present invention to provide a semiconductor device having a higher capability of heat radiation and preventing warpage due to a thermal stress.

A semiconductor device according to the present invention includes a case, an external terminal, an insulating plate, a first conductor layer, a second conductor layer, a third conductor layer, a semiconductor chip, a sealing part, and a wiring part. The external terminal is attached to the case. The insulating plate has a first surface and a second surface being opposite to the first surface and surrounded by the case. The first conductor layer is provided on a first surface of the insulating plate, is made of one conductive material, and has a first volume. The second conductor layer is provided on a second surface of the insulating plate, is made of the one conductive material, and has a second volume. The third conductor layer is provided on the second surface of the insulating plate away from the second conductor layer, is made of the one conductive material, and has a third volume. The third conductor layer has a mounting region thicker than the second conductor layer. The sum of the second and third volumes is greater than or equal to 70% and smaller than or equal to 130% of the first volume. The semiconductor chip is provided on the third conductor layer. The sealing part is formed of an insulator and seals the semiconductor chip within the case. A wiring part is within the sealing part and short-circuits the semiconductor chip and at least one of the external terminal and the second conductor layer.

According to the present invention, compared to a case where the mounting region is as thick as the second conductor layer, disposing the semiconductor chip on the mounting region thicker than the second conductor layer allows a high capability of heat radiation, and particularly a reduced transient thermal resistance. Further, the sum of the volumes of the second and third conductor layers provided on the second surface of the insulating plate is greater than or equal to 70% and smaller than or equal to 130% of the volume of the first conductor layer provided on the first surface of the insulating plate, and thus a difference of thermal stresses decreases between the first surface and second surface of the insulating plate. This allows preventing the warpage of the insulating plate. Consequently, it is possible to achieve the semiconductor device having the high capability of heat radiation and preventing the warpage due to the thermal stress.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a graph showing an example of a transient thermal resistance of the semiconductor device in FIG. 1;

FIG. 7 is a graph showing an example of a relationship between the ratio of the sum of volumes V2 and V3 to a volume 1, and the amount of warpage of an insulating plate;

DESCRIPTION OF THE PREFERRED EMBODIMENTS

Based on the drawings, the following describes preferred embodiments of the present invention.

First Preferred Embodiment

Configuration

Figure 1:
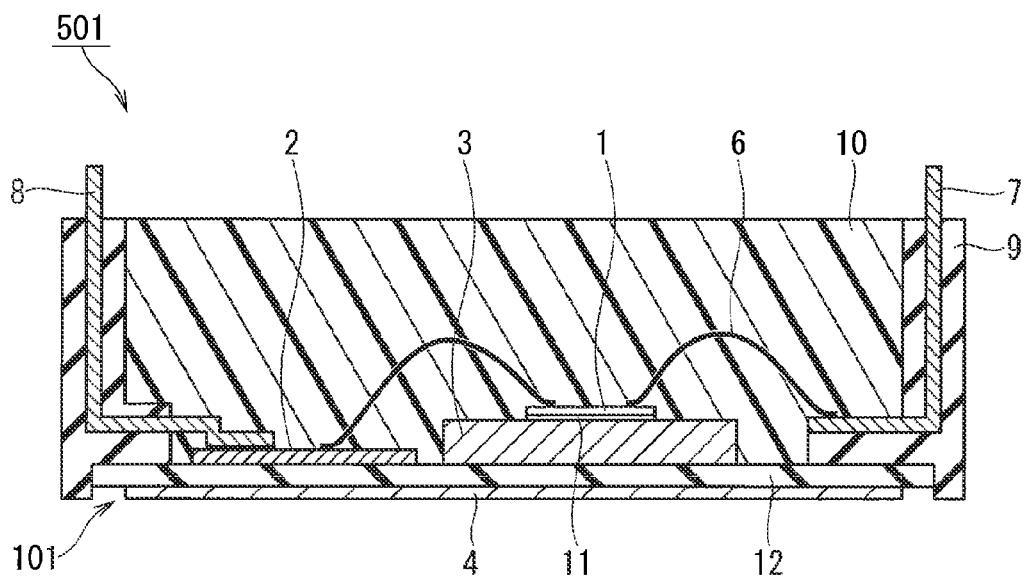
FIG. 1 is a cross-sectional view schematically showing the configuration of a semiconductor device according to a first preferred embodiment of the present invention.
Figure 2:
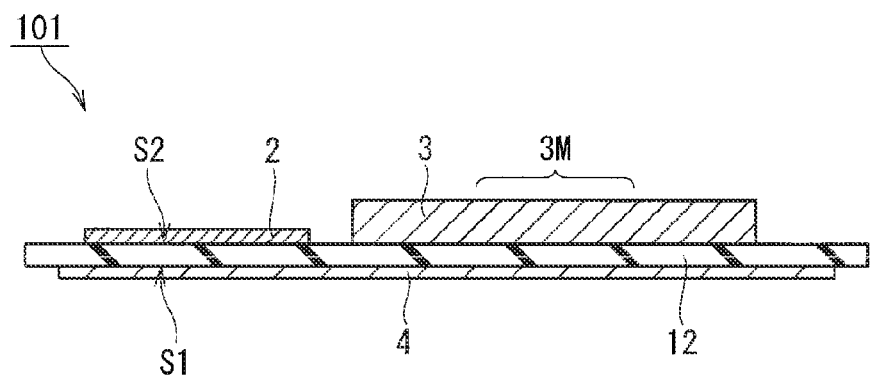
FIG. 2 is a schematic cross-sectional view taken along line II-II in FIG. 3, showing the configuration of a circuit substrate of the semiconductor device in FIG. 1.
Figure 3:
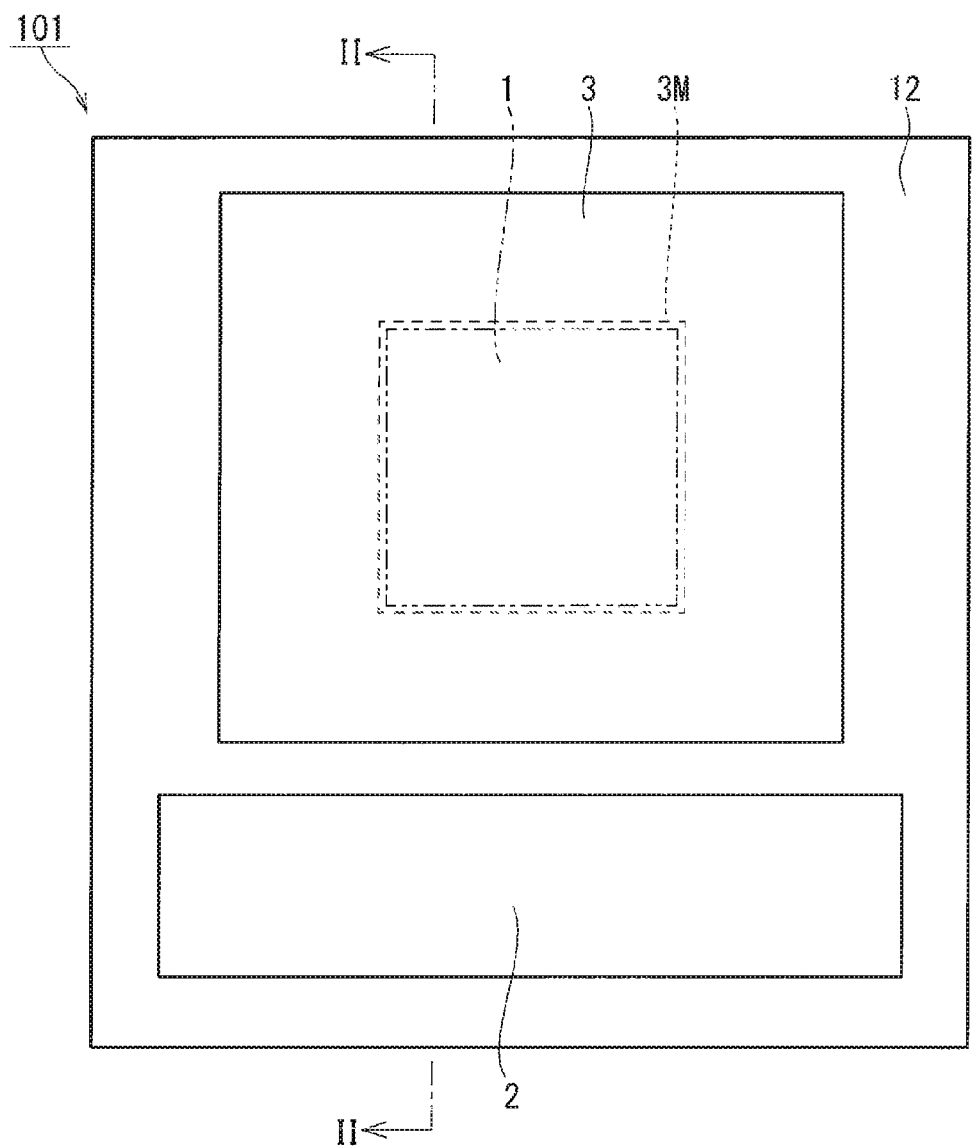
FIG. 3 is a plan view schematically showing the configuration of the circuit substrate of the semiconductor device in FIG. 1.

Referring to FIG. 1, a semiconductor device 501 according to the preferred embodiment includes a case 9, a signal terminal 7 (external terminal), a main terminal 8 (external terminal), a semiconductor chip 1, a solder part 11, a sealing part 10, wires 6 (wiring parts), and a circuit substrate 101. Further, referring to FIGS. 2 and 3, the circuit substrate 101 includes an insulating plate 12, a circuit pattern 4 (first conductor layer), a circuit pattern 2 (second conductor layer), and a circuit pattern 3 (third conductor layer). Note that FIG. 3 shows a mounting region 3M of the circuit pattern 3 indicated by a dashed line and the semiconductor chip 1 indicated by a two-dot chain line, as well as the shape of the circuit substrate 101.

The insulating plate 12 is made of ceramic including alumina, silicon nitride, or aluminum nitride for instance. The insulating plate 12 has a lower surface S1 (first surface), and an upper surface (second surface) opposite to the lower surface S1 and surrounded by the case 9.

The circuit pattern 4 is provided on the lower surface S1 of the insulating plate 12. A cooler (not shown), such as a cooling fin, may be attached on the circuit pattern 4. The cooler can be attached with heat conduction grease for instance. The circuit pattern 2 is provided on the upper surface S2 of the insulating plate 12. The circuit pattern 2 is part of an electrical circuit of the semiconductor device 501. The circuit pattern 3 is provided on the upper surface S2 and away from the circuit pattern 2. The circuit pattern 3 has the mounting region 3M thicker than the circuit pattern 2. The mounting region 3M preferably has a thickness of greater than or equal to 0.6 mm. The circuit patterns 2 to 4 are made of one conductive material, such as copper or aluminum. Note that in the present embodiment, the circuit pattern 3 has a flat surface as shown in FIG. 2, and thus has no particular shape along the dashed line (FIG. 3) that indicates the mounting region 3M.

The circuit pattern 4 has a volume V1 (first volume), the circuit pattern 2 has a volume V2 (second volume), and the circuit pattern 3 has a volume V3 (third volume). The sum of the volumes V2 and V3 is greater than or equal to 70% and smaller than or equal to 130% of the volume V1.

The semiconductor chip 1 is provided on the mounting region 3M of the circuit pattern 3. Specifically, the semiconductor chip 1 is bonded on the mounting region 3M of the circuit pattern 3 by the solder part 11. The semiconductor chip 1 typically has a quadrangle shape with four angles as shown in FIG. 3.

The case 9 is formed of an insulator, and preferably of a resin such as a poly phenylene sulfide (PPS) and a polybutylene terephthalate (PBT).

The signal terminal 7 and the main terminal 8 are attached to the case 9. The signal terminal 7 and the main terminal 8 are for an electrical connection to the outside of the semiconductor device 501. Specifically, the signal terminal 7 is for an input of a control signal for the semiconductor chip 1, and the main terminal 8 is for an input/output of a main voltage or main current of the semiconductor chip 1.

The sealing part 10 seals the semiconductor chip 1, and the circuit patterns 2 and 3 within the case 9. The sealing part 10 is formed of an insulator having a linear expansion coefficient greater than that of the insulating plate 12 such as a silicone gel (liner expansion coefficient: about 200-350 ppm/K) or an epoxy resin, for instance. The sealing part 10 is preferably made of a thermosetting epoxy resin having a liner expansion coefficient of greater than or equal to 9 ppm/K and smaller than or equal to 12 ppm/K.

The wires 6 are within the sealing part 10. The wires 6 short-circuit the semiconductor chip 1 and at least any of the signal terminal 7, the main terminal 8 and the circuit pattern 2.

Comparative Example

Figure 4:
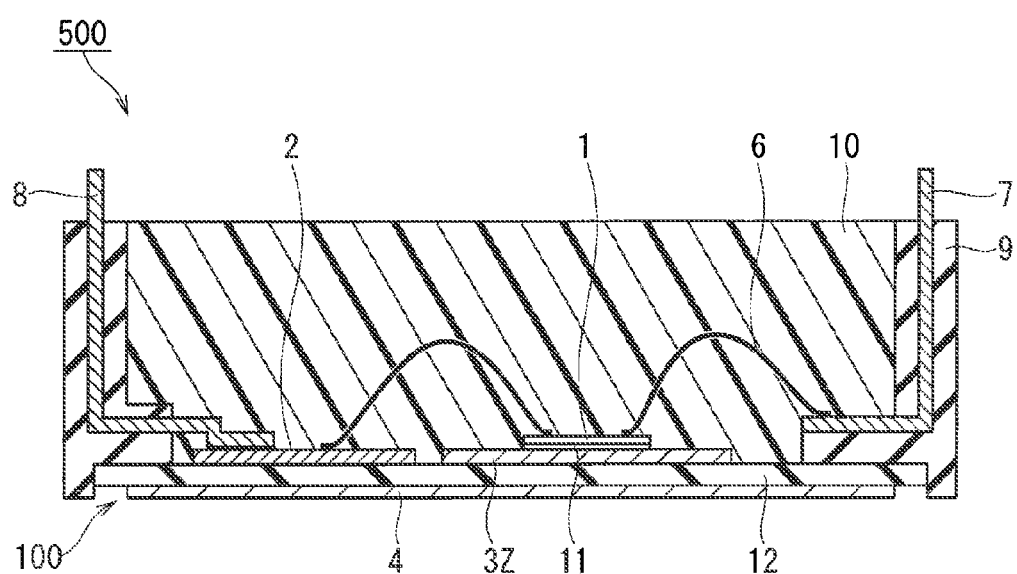
FIG. 4 is a cross-sectional view showing the configuration of a semiconductor device in a comparative example.

Referring to FIG. 4, a circuit pattern 3Z instead of the circuit pattern 3 is provided on a circuit substrate 100 of a semiconductor device in a comparative example. The circuit patterns 3Z and 2 are formed by etching a metal plate of a uniform thickness bonded on the insulating plate 12 with a wax material. The circuit pattern 3Z is thus as thick as the circuit pattern 2. Moreover, the thickness of the circuit pattern 3Z is smaller than or equal to 0.5 mm for simplified etching.

Figure 5:
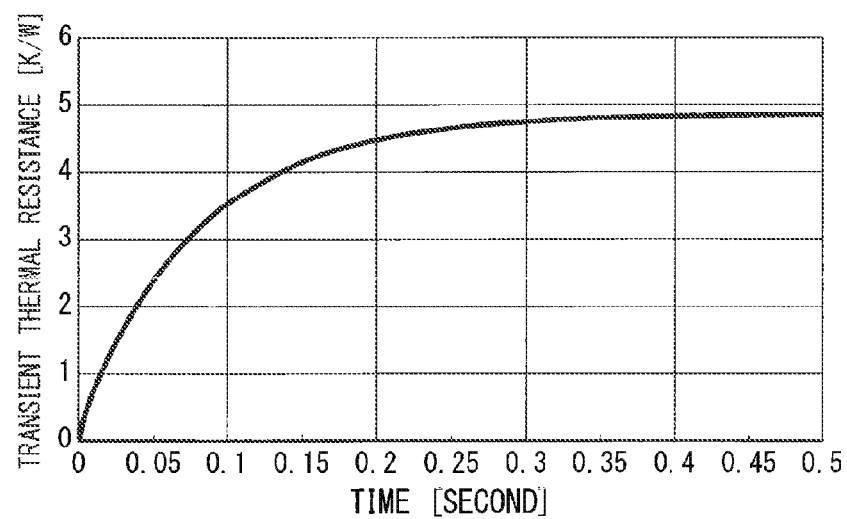
FIG. 5 is a graph showing an example of a transient thermal resistance of the semiconductor device in FIG. 4.

FIG. 5 shows experimental results of a relationship between a transient thermal resistance on a heat radiation path from a position where the semiconductor chip 1 is attached on the circuit pattern 3Z (upper surface of the circuit substrate 100) to a position where a cooling tin (not shown) is attached on the circuit pattern 4 (lower surface of the circuit substrate 100), and heat generation time of the semiconductor chip 1. One example of the results includes a transient heat resistance of 3.5 K/W to 0.1 second. To decrease this value, commonly-used methods include a method of mounting an alternative component serving as a heat spreader onto the circuit pattern 3 by soldering, and a method of providing a copper base plate onto the circuit pattern 4 by soldering.

A circuit substrate is commonly configured such that an insulating plate of aluminum nitride (liner expansion coefficient: about 4.5 ppm/K) or silicon nitride (liner expansion coefficient: about 2.5 ppm/K) is interposed between with circuit patterns of copper (liner expansion coefficient: about 18 ppm/K). In other words, there is a mismatch in linear expansion coefficient between the insulating plate and the circuit pattern. Consequently, a stress due to temperature changes, namely a thermal stress can occur. A thermal-stress imbalance between the upper and lower surfaces of the circuit substrate 100 causes warpage in the circuit substrate 100. A pattern including the circuit patterns 2 and 3Z, which is patterned depending on a circuit required for the semiconductor device 500, is not necessarily on most of the upper surface of the insulating plate 12. The circuit pattern 4, in contrast, has a pattern (solid pattern) to simply cover the almost entire back surface of the insulating plate 12. In this way, the warpage due to the thermal stress easily occurs in the circuit substrate 100 because of a big difference between the area of the circuit pattern 4 on the lower surface of the insulating plate 12, and the areas of the circuit patterns 2 and 3Z of the upper surface of the insulating plate 12.

Example of Embodiment

FIG. 6 shows experimental results of a relationship between a transient thermal resistance on a heat radiation path from a position where the semiconductor chip 1 is attached on the circuit pattern 3 (upper surface of the circuit substrate 101) to a position where the cooling fin (not shown) is attached on the circuit pattern 4 (lower surface of the circuit substrate 101), and heat generation time of the semiconductor chip 1. The results have revealed that the semiconductor device 501 has a transient thermal resistance lower than that of the semiconductor device 500. One such example includes that the semiconductor device 501 has a transient thermal resistance of 3.0 K/W (FIG. 6) to 0.1 second, whereas the semiconductor device 500 has a transient thermal resistance of 3.5 K/W (FIG. 5) to 0.1 second.

FIG. 7 shows experimental results of a relationship between the ratio of the sum of the volume V2 of the circuit pattern 2 and the volume V3 of the circuit pattern 3 to the volume V1 of the circuit pattern 4, and the amount of warpage of the insulating plate 12 while the temperature of the semiconductor chip 1 is rising. Here, any positive warpage indicates warpage toward the lower surface of the insulating plate 12 (toward the circuit pattern 4), and any negative warpage indicates warpage toward the upper surface of the insulating plate 12 (toward the circuit patterns 2 and 3). The results have revealed that a ratio of greater than or equal to 70% reduces the positive warpage prominently. The results also have revealed that a ratio of smaller than or equal to 130% reduces the negative warpage prominently.

Summary of Effect

According to the present embodiment, disposing the semiconductor chip 1 on the mounting region 3M thicker than the circuit pattern 2 allows an enhanced capability of heat radiation, and particularly a reduced transient thermal resistance, compared to a case where mounting region 3M is as thick as the circuit pattern 2. Further, the sum (V2+V3) of the volumes of the circuit patterns 2 and 3 provided on the upper surface S2 of the insulating plate 12 is greater than or equal to 70% and smaller than or equal to 130% of the volume V1 of the circuit pattern 4 provided on the lower surface S1 of the insulating plate 12, and thus a difference decreases between a thermal stress on the lower surface S1 and thermal stress on the upper surface S2 of the insulating plate 12. This prevents warpage of the insulating plate 12. Consequently, the semiconductor device 501 having high heat radiation and preventing warpage due to a thermal stress is achieved.

In particular, when the cooling fin is attached on the circuit pattern 4, any gaps between the circuit pattern 4 and the cooling fin due to warpage of the circuit substrate 101 cause a reduction in cooling effect of the cooling fin. Such a reduction can be prevented by preventing the warpage as described above.

The circuit pattern 2 is thinner than the mounting region 3M. This allows a reduction in manufacture cost compared to the case where the circuit pattern 2 is as thick as the mounting region 3M.

When the mounting region 3M of the circuit pattern 3 has a thickness of greater than or equal to 0.6 mm, a heat radiation capability of the circuit substrate 101 is more sufficiently enhanced.

When the sealing part 10 is made of a thermosetting epoxy resin having the liner expansion coefficient of greater than or equal to 9 ppm/K and smaller than or equal to 12 ppm/K, such a linear expansion coefficient can be closer to that of the circuit substrate 101 having the circuit patterns 4, 2, 3 and the insulating plate 12. Consequently, it is possible to prevent the warpage of the semiconductor device 501 due to temperature changes.

The wire 6, which is restrained within the sealing part 10 in its entirety, contracts along with the sealing part 10 in a thermal expansion/contraction. Meanwhile, the wire 6 has edge portions bonded to the circuit substrate 101. Accordingly, when a thermal expansion/contraction occurs due to heating of the semiconductor chip 1 or due to changes in preservation temperature of the semiconductor device 501, a great stress can be applied at the edge portions of the wire 6 due to a difference of the linear expansion coefficient between the circuit substrate 101 and the sealing part 10. When the sealing part 10 is made of a thermosetting epoxy resin having the liner expansion coefficient of greater than or equal to 9 ppm/K and smaller than or equal to 12 ppm/K as described above, the aforementioned difference of the linear expansion coefficient decreases, thus reducing the magnitude of the stress applied to the edge portion of the wire 6. Consequently, the joint portions of the wire 6 have a longer lifetime.

Second Preferred Embodiment

Figure 8:
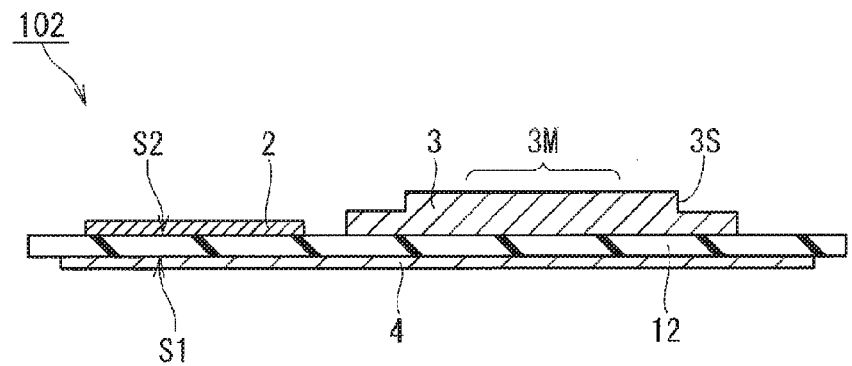
FIG. 8 is a cross-sectional view schematically showing the configuration of a circuit substrate of a semiconductor device according to a second embodiment of the present invention.

Referring to FIG. 8, in a circuit substrate 102 of a semiconductor device according to the preferred embodiment, a circuit pattern 3 has a step 3S outside a mounting region 3M. The surface height of the circuit pattern 3 preferably increases from the outside of the mounting region 3M toward the mounting region 3M. In other words, the mounting region 3M is preferably thicker than the outer periphery outside the mounting region 3M in the circuit pattern 3. Note that the configuration other than those set forth above is substantially identical to those of the above-described first preferred embodiment. Therefore, the same or corresponding elements have the same reference numerals allotted, and description thereof will not be repeated.

In accordance with the present embodiment, it is possible to stop a solder flow at the step 3S in soldering a semiconductor chip 1 to be bonded by a solder part 11 (FIG. 1). Consequently, an unnecessary solder flow around the mounting region 3M is prevented. This reduces an area of a low-adhesion interface between the solder part 11 and the sealing part 10. Accordingly, the sealing part 10 is prevented from peeling from the circuit pattern 3.

Third Preferred Embodiment

Figure 9:
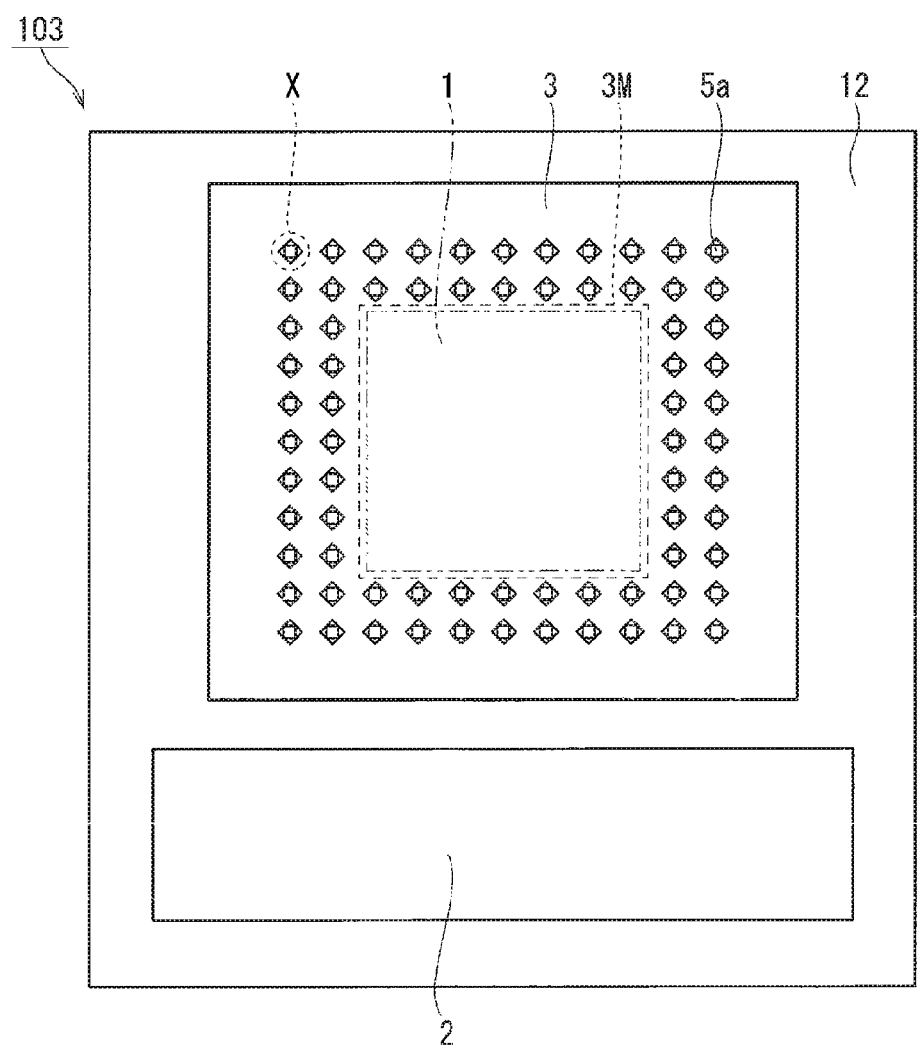
FIG. 9 is a plan view schematically showing the configuration of a circuit substrate of a semiconductor device according to a third embodiment of the present invention.
Figure 10:
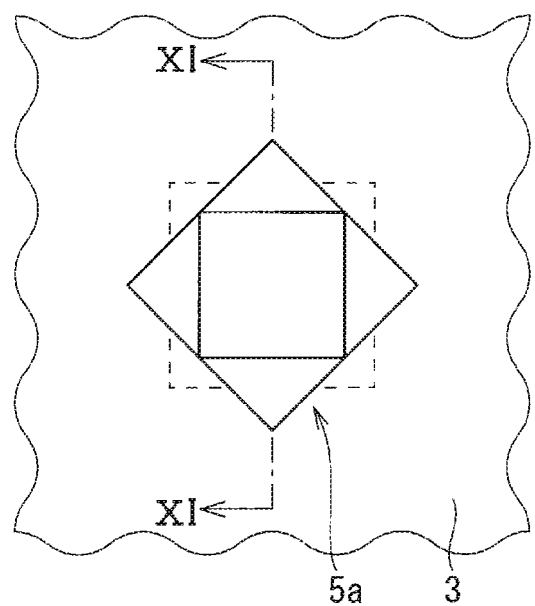
FIG. 10 is an enlarged view of a dashed-lined portion X in FIG. 9.
Figure 11:
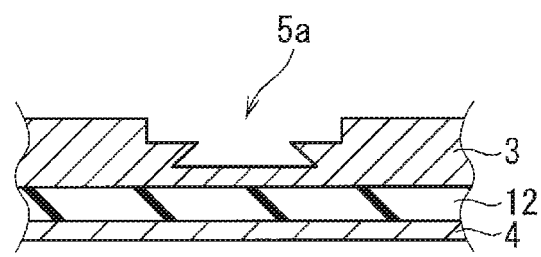
FIG. 11 is a schematic partial cross-sectional view taken along line XI-XI in FIG. 10.

Referring to FIGS. 9 to 11, in a circuit substrate 103 of a semiconductor device according to the preferred embodiment, a circuit pattern 3 has a recess portion outside a mounting region 3M. Specifically, the circuit pattern 3 has dimple portions 5a outside the mounting region 3M. Preferably, the dimple portion 5a has an inverted taper shape in a depth direction (see the lower part of the dimple portion 5a in FIG. 11). A sealing part 10 (FIG. 1) enters the inside of the dimple portion 5a. Note that the configuration other than those set forth above is substantially identical to those of the above-described first preferred embodiment. Therefore, the same or corresponding elements have the same reference numerals allotted, and description thereof will not be repeated.

According to the present embodiment, the sealing part 10 enters the inside of the dimple portion 5a when the sealing part 10 is formed, and more specifically, when a resin is poured onto the circuit substrate 103 to form the sealing part 10. Accordingly, the sealing part 10 is prevented from peeling from the circuit pattern 3. When the dimple portion 5a has the inverted taper shape, its anchor effect prevents such peeling with more reliability.

Further, the dimple portion 5a provided around the mounting region 3M relives a thermal stress near the edges of the circuit pattern 3 due to heating of a semiconductor chip 1 or due to changes in preservation temperature of the semiconductor device. Accordingly, the stress applied at the edges of the circuit pattern 3 is relieved. Consequently, it is possible to prevent the circuit pattern 3 from the peeling due to such a repeated stress applied.

A wire 6 (FIG. 1), which is restrained within the sealing part 10 (FIG. 1) in its entirety, contracts along with the sealing part 10 in a thermal expansion/contraction. Meanwhile, the wire 6 has an edge portions bonded to the circuit substrate 101. Accordingly, when a thermal expansion/contraction occurs due to the heating of the semiconductor chip 1 or due to the changes in preservation temperature of the semiconductor device, a great stress can be applied at the edge portions of the wire 6 due to a difference of the linear expansion coefficient between the circuit substrate 101 and the sealing part 10. The sealing part 10 and the circuit substrate 103 are restrained from each other by the dimple portion 5a as described above, thus reducing an expansion and contraction difference between the sealing part 10 and the circuit substrate 103 in the thermal expansion/contraction due to the temperature changes of the semiconductor device. Hence, the magnitude of the stress applied to the edge portions of the wire 6 is reduced. Consequently, the joint portions of the wire 6 have a longer lifetime.

Fourth Preferred Embodiment

Figure 12:
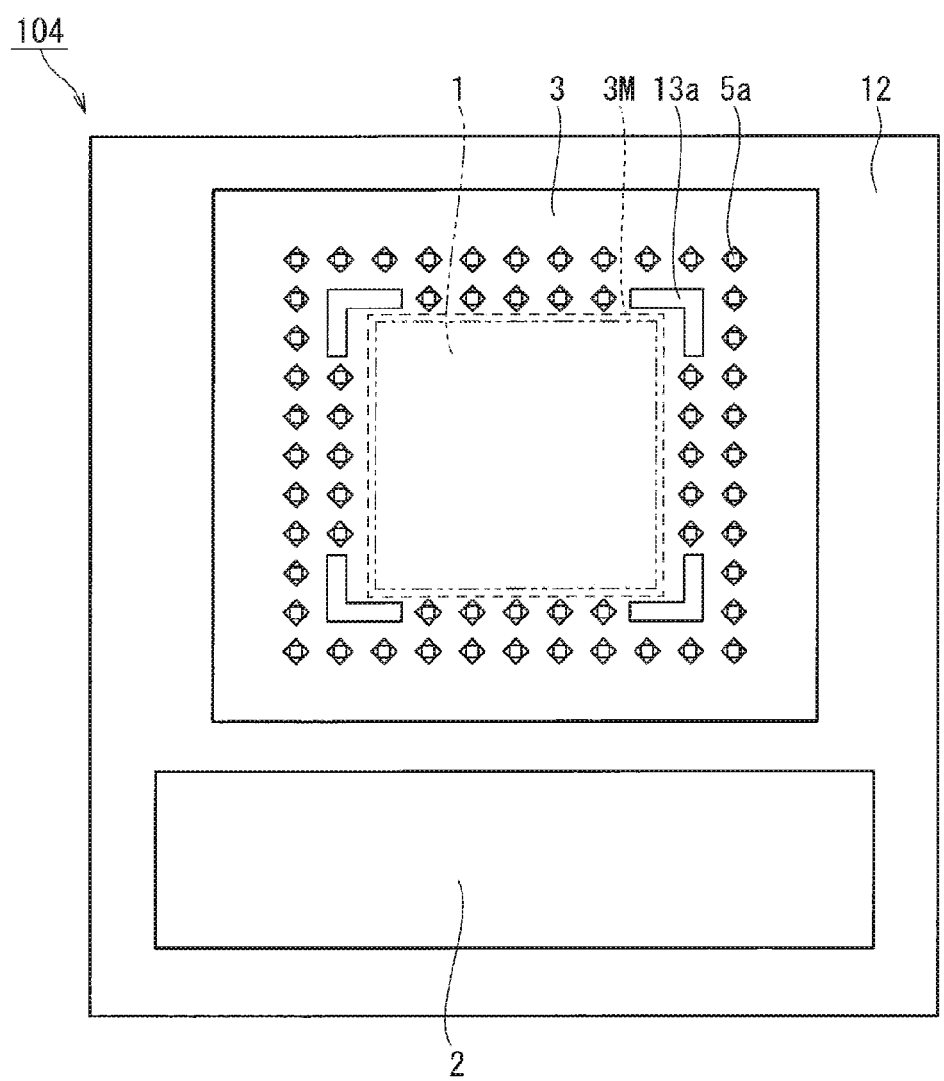
FIG. 12 is a plan view schematically showing the configuration of a circuit substrate of a semiconductor device according to a fourth embodiment of the present invention.
Figure 13:
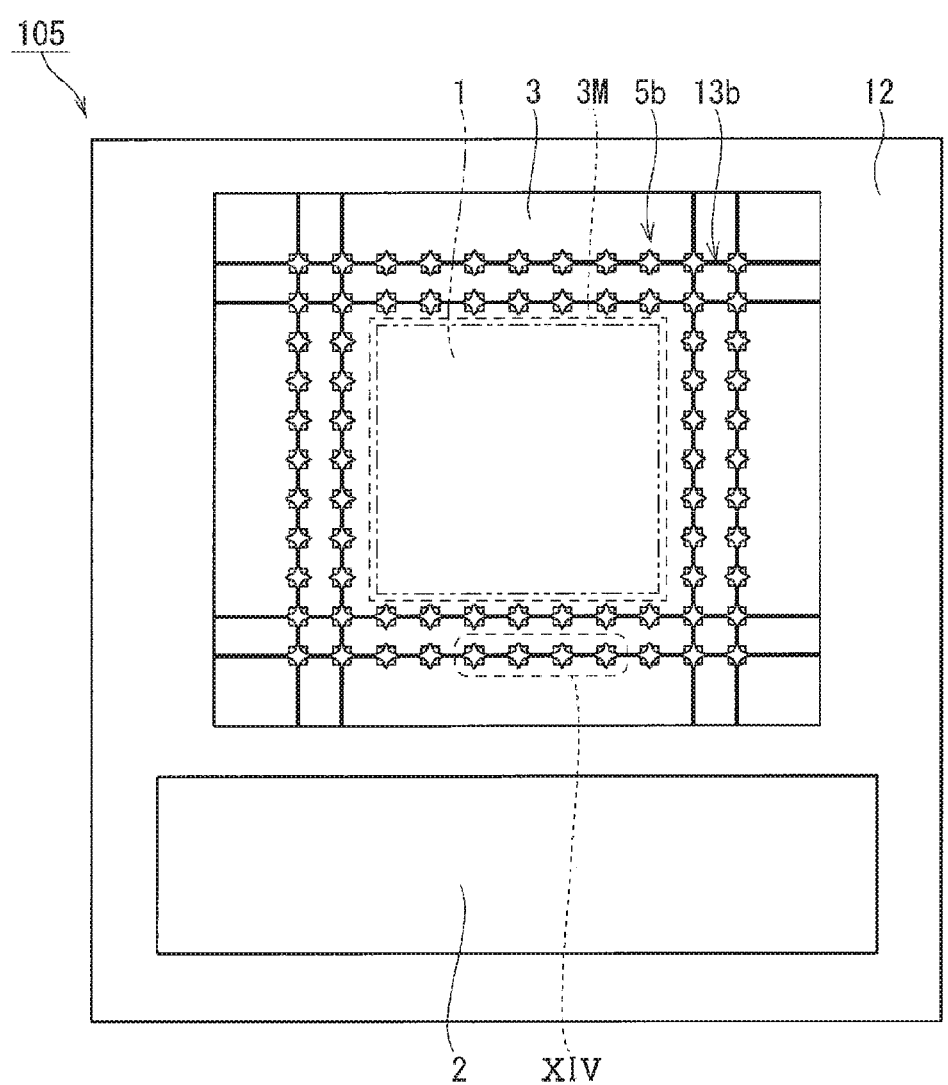
FIG. 13 is a plan view schematically showing the configuration of a circuit substrate of a semiconductor device according to a fifth embodiment of the present invention.
Figure 14:
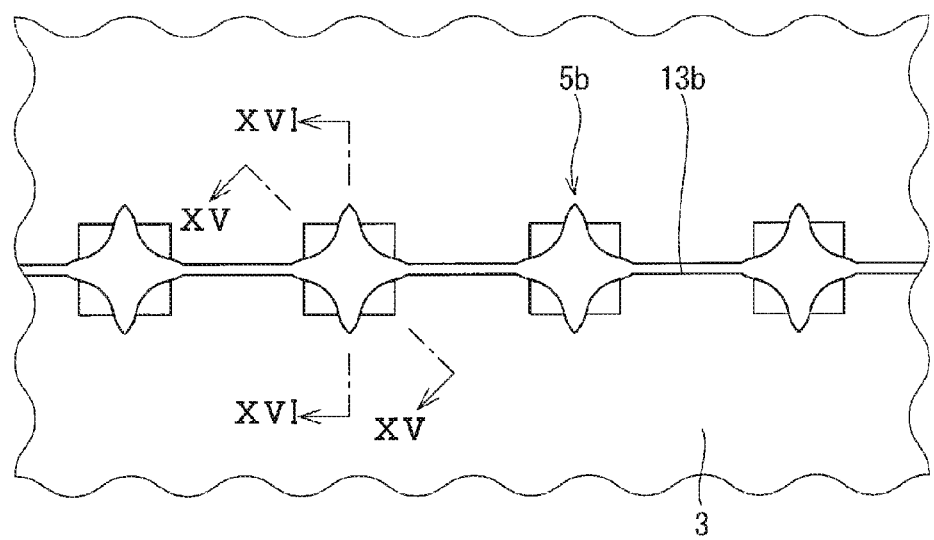
FIG. 14 is an enlarged view of a dashed-lined portion XIV.
Figure 15:
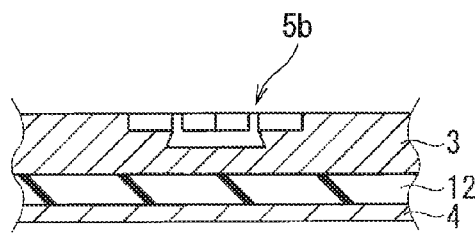
FIG. 15 is a schematic partial cross-sectional view taken along line XV-XV in FIG. 14.
Figure 16:
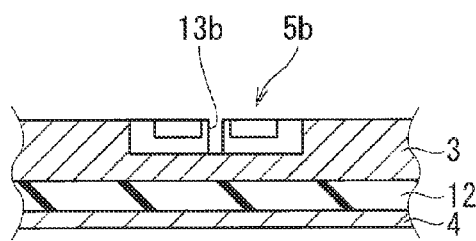
FIG. 16 is a schematic partial cross-sectional view taken along line XVI-XVI in FIG. 14.

Referring to FIG. 12, in a circuit substrate 104 of a semiconductor device according to the preferred embodiment, a recess portion of a circuit pattern 3 includes, in addition to the aforementioned dimple portion 5a, four slit portions 13a extending along the four angles of a semiconductor chip 1, respectively. Note that a space may be provided between the semiconductor chip 1 and the slit portion 13a in a plan view (FIG. 12).

Note that the configuration other than those set forth above is substantially identical to those of the above-described third preferred embodiment. Therefore, the same or corresponding elements have the same reference numerals allotted, and description thereof will not be repeated.

According to the present embodiment, it is possible to stop a solder flow at the slit portions 13a (FIG. 12) near the four angles of the semiconductor chip 1 in soldering the semiconductor chip 1 to be bonded by a solder part 11 (FIG. 1). This prevents a displacement of a mounting position of the semiconductor chip 1 on the circuit pattern 3. Moreover, the slit portion 13a relives a stress around the mounting region 3M. Consequently, the stress applied at the edges of the circuit pattern 3 can be relieved.

Note that these advantageously effects are obtained without the dimple portion 5a.

Fifth Preferred Embodiment

Referring to FIGS. 13 to 16, in a circuit substrate 105 of a semiconductor device according to the preferred embodiment, a recess portion of a circuit pattern 3 has dimple portions 5b and a slit portion 13b. The dimple portions 5b are provided away from the edge of the circuit pattern 3. The slit portion 13b connects the dimple portions 5b to each other, and extends to the edge of the circuit pattern 3. Note that the configuration other than those set forth above is substantially identical to those of the above-described first preferred embodiment. Therefore, the same or corresponding elements have the same reference numerals allotted, and description thereof will not be repeated.

According to the present embodiment, the air within the dimple portion 5b is easily released through the slit portion 13b when the sealing part 10 (FIG. 1) is formed, and more specifically, when a resin is poured onto the circuit substrate 105 to form the sealing part 10. Accordingly, the sealing part 10 sufficiently enters the dimple portion 5b. Thus, the sealing part 10 is more sufficiently prevented from peeling from the circuit pattern 3. Such an advantageous effect is well obtained particularly when the sealing part 10 is made of an epoxy resin.

It is to be noted that in the present invention, respective preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:
1. A semiconductor device, comprising:
a case;
an external terminal attached to said case;
an insulating plate having a first surface and a second surface, said second surface being opposite to said first surface and surrounded by said case;
a first conductor layer provided on said first surface of said insulating plate, made of one conductive material, and having a first volume;
a second conductor layer provided on said second surface of said insulating plate, made of said one conductive material, and having a second volume;
a third conductor layer provided on said second surface of said insulating plate and away from said second conductor layer, made of said one conductive material, and having a third volume, said third conductor layer having a semiconductor chip mounting region thicker than said second conductor layer, the sum of said second and third volumes being greater than or equal to 70% and smaller than or equal to 130% of said first volume;
a semiconductor chip provided on said mounting region of said third conductor layer;
a sealing part that is formed of an insulator and seals said semiconductor chip within said case; and
a wiring part that is within said sealing part, and short-circuits said semiconductor chip and at least one of said external terminal and said second conductor layer.
2. The semiconductor device according to claim 1, wherein said mounting region of said third conductor layer has a thickness of greater than or equal to 0.6 mm.

3. The semiconductor device according to claim 1, wherein said third conductor layer has a step outside said mounting region.

4. The semiconductor device according to claim 1, wherein said third conductor layer has a recess portion outside said mounting region.

5. The semiconductor device according to claim 4, wherein said recess portion includes a portion having an inverted taper shape in a depth direction.

6. The semiconductor device according to claim 4, wherein
 said semiconductor chip has a quadrangle shape with four angles, and
 said recess portion of said third conductor layer includes four slit portions extending along the four angles of said semiconductor chip, respectively.

7. The semiconductor device according to claim 4, wherein said recess portion of said third conductor layer includes:
 a plurality of dimple portions provided away from the edge of said third conductor layer; and
 a slit portion connecting said plurality of dimple portions to each other and extending to the edge of said third conductor layer.

8. The semiconductor device according to claim 1, wherein said sealing part is made of a thermosetting epoxy resin having a liner expansion coefficient of greater than or equal to 9 ppm/K and smaller than or equal to 12 ppm/K.

* * * * *